United States Patent
Yabe et al.

(10) Patent No.: US 7,606,106 B2
(45) Date of Patent: Oct. 20, 2009

(54) SEMICONDUCTOR MEMORY DEVICE

(75) Inventors: Tomoaki Yabe, Kawasaki (JP); Akihito Tohata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 11/854,807

(22) Filed: Sep. 13, 2007

(65) Prior Publication Data

US 2008/0068915 A1    Mar. 20, 2008

(30) Foreign Application Priority Data

Sep. 15, 2006    (JP)    ............................. 2006-251603

(51) Int. Cl.
*G11C 5/14*    (2006.01)
(52) U.S. Cl. ..................... 365/227; 365/226; 365/119; 365/230.06
(58) Field of Classification Search ................. 365/226, 365/227, 229, 230.06
See application file for complete search history.

(56) References Cited

U.S. PATENT DOCUMENTS

| | | | |
|---|---|---|---|
| 6,188,628 B1 | 2/2001 | Tomotani et al. | |
| 6,525,984 B2 * | 2/2003 | Yamagata et al. | ........... 365/226 |
| 7,385,841 B2 * | 6/2008 | Houston | ...................... 365/154 |
| 2007/0035987 A1 * | 2/2007 | Houston | ...................... 365/154 |

FOREIGN PATENT DOCUMENTS

| | | |
|---|---|---|
| JP | 11-219589 | 8/1999 |
| JP | 2000-298987 | 10/2000 |

* cited by examiner

*Primary Examiner*—Son Dinh
(74) *Attorney, Agent, or Firm*—Oblon, Spivak, McClelland, Maier & Neustadt, L.L.P.

(57) ABSTRACT

A semiconductor memory device operates by using a fixed power and a variable power. The device includes a plurality of word lines which select rows of a memory cell array, a plurality of word line drivers each of which is connected to a corresponding one of the word lines and includes a first CMOS gate, a first cutoff switch which is connected between a fixed power terminal and a power terminal of the first CMOS gate and cuts off the fixed power in a sleep mode, a switching circuit which is connected to the plurality of word lines and connects the plurality of word lines to a ground terminal in the sleep mode, and a power control circuit which generates the variable power by using the fixed power and sets the variable power to 0 V in the sleep mode.

19 Claims, 4 Drawing Sheets

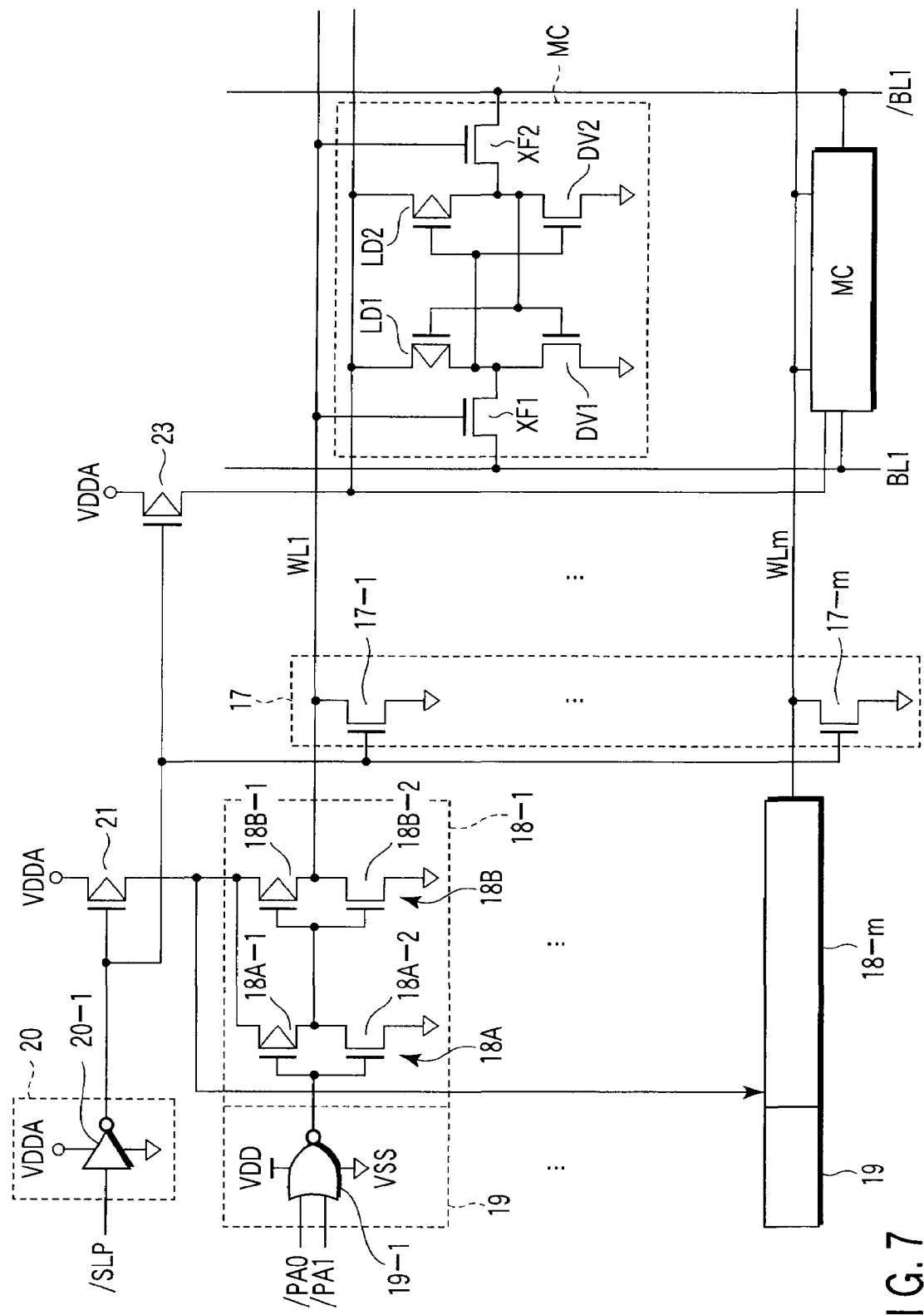
F I G. 7

SEMICONDUCTOR MEMORY DEVICE

CROSS-REFERENCE TO RELATED APPLICATIONS

This application is based upon and claims the benefit of priority from prior Japanese Patent Application No. 2006-251603, filed Sep. 15, 2006, the entire contents of which are incorporated herein by reference.

BACKGROUND OF THE INVENTION

1. Field of the Invention

The present invention relates to a semiconductor memory device and, for example, a semiconductor memory device having static memory cells.

2. Description of the Related Art

A static random access memory (SRAM) is known as a kind of semiconductor memory device. The SRAM uses, as a memory cell, an SRAM cell (six-transistor SRAM cell) including, e.g., six metal oxide semiconductor (MOS) transistors.

The six-transistor SRAM cell comprises two inverter circuits. The output terminal of one inverter circuit is connected to the input terminal of the other inverter circuit. The six-transistor SRAM cell also has two transfer gates which connect the two data storage nodes of the SRAM cell to bit lines in the data read and write modes. The transfer gates are connected to a word line which turns the transfer gates on or off.

A row decoder to select word lines and a word line driver to drive the word lines on the basis of the decode signal of the row decoder are connected to the word lines. For example, a variable power supply voltage VDD of about 0 to 1.2 V is applied to the row decoder, and a fixed power supply voltage VDDA of about 1.2 V is applied to the word line driver. The power consumption can be reduced by dynamically changing the variable power supply voltage VDD in accordance with the operation mode of the chip.

The SRAM cell cannot greatly decrease the power supply voltage because of the need for ensuring the data hold stability. The word line potential cannot greatly be decreased, either, from the viewpoint of ensuring a write margin and ensuring a cell current. For these reasons, the fixed power supply voltage VDDA of about 1.2 V is applied to the SRAM cells and word line driver in an SRAM of, e.g., 65-nm generation.

As described above, the variable power supply voltage VDD is applied to the row decoder. Hence, the decode signal of the row decoder swings within the range of about 0 to 1.2 V. When the decode signal is high (i.e., when a word line is selected), and the variable power supply voltage VDD is 1.2 V or less, the high-level voltage of the decode signal also drops to 1.2 V or less. Since the P-channel MOS transistor of the first-stage inverter circuit included in the word line driver that receives the decode signal cannot be completely turned off, the through current flowing to the first-stage inverter circuit increases. This increases the leakage current of the word line driver.

An associated technique of this type is disclosed, which reduces power consumption by providing a switch in a peripheral circuit of a memory cell array and causing the switch to cut off a fixed power supply (Jpn. Pat. Appln. KOKAI Publication No. 11-219598).

BRIEF SUMMARY OF THE INVENTION

According to an aspect of the present invention, there is provided a semiconductor memory device which operates by using a fixed power and a variable power, comprising:

a plurality of word lines which select rows of a memory cell array;

a plurality of word line drivers each of which is connected to a corresponding one of the word lines and includes a first CMOS gate;

a first cutoff switch which is connected between a fixed power terminal and a power terminal of the first CMOS gate and cuts off the fixed power in a sleep mode;

a switching circuit which is connected to the plurality of word lines and connects the plurality of word lines to a ground terminal in the sleep mode;

a power control circuit which generates the variable power by using the fixed power and sets the variable power to 0 V in the sleep mode; and a row decoder to which the variable power is applied and which is connected to the plurality of word line drivers and selects a word line on the basis of an address signal.

BRIEF DESCRIPTION OF THE SEVERAL VIEWS OF THE DRAWING

FIG. 7 is a circuit diagram illustrating the arrangement of main parts of an SRAM 2 according to a third embodiment of the present invention.

DETAILED DESCRIPTION OF THE INVENTION

The embodiments of the present invention will be described below with reference to the accompanying drawing. In the following description, the same reference numbers denote elements with the same functions and arrangements, and a description thereof will be done only if necessary.

First Embodiment

Figure 1:
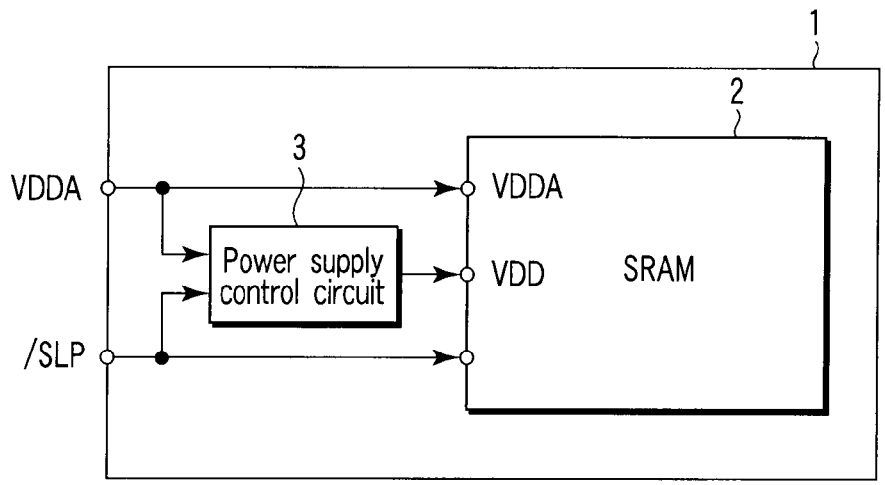
FIG. 1 is a block diagram illustrating the arrangement of a semiconductor memory device 1 according to a first embodiment of the present invention.

FIG. 1 is a block diagram illustrating the arrangement of a semiconductor memory device 1 according to the first embodiment of the present invention. The semiconductor memory device 1 includes an SRAM 2 and a power supply control circuit 3. An external device applies a fixed power supply voltage VDDA and a sleep signal /SLP to the semiconductor memory device 1. The sleep signal /SLP may be generated in the semiconductor memory device 1 on the basis of, e.g., a mode select signal from the external device.

Figure 2:
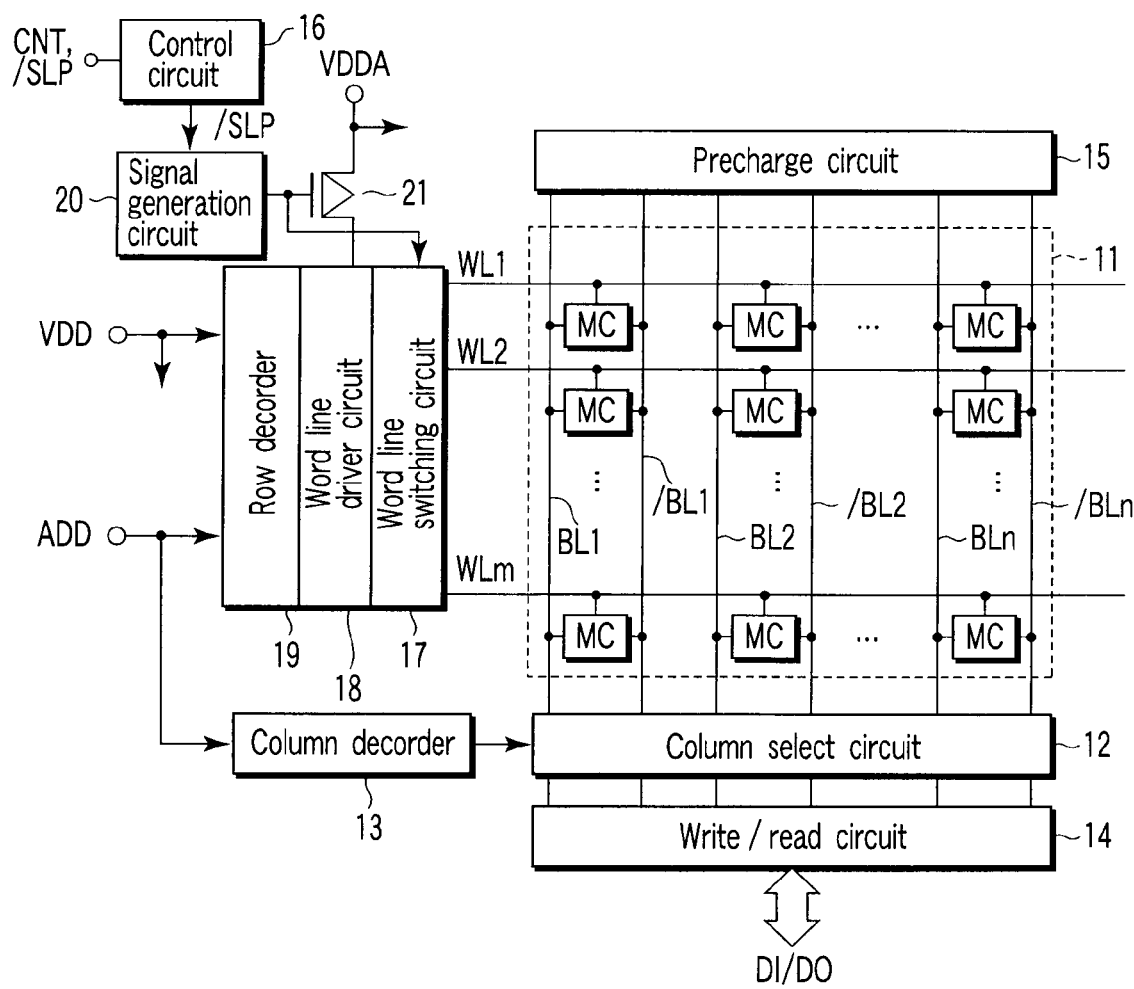
FIG. 2 is a block diagram illustrating the arrangement of an SRAM 2 shown in FIG. 1.

FIG. 2 is a block diagram illustrating the arrangement of the SRAM 2 shown in FIG. 1. The SRAM 2 has a memory cell array 11 in which a plurality of static memory cells MC are arrayed in a matrix. A plurality of word lines WL1 to WLm running in the row direction are disposed on the memory cell array 11. A plurality of pairs of bit lines BL1 and /BL1 to BLn and /BLn running in the column direction are disposed on the memory cell array 11. A word line WL selects a row of the memory cell array 11. A pair of bit lines BL and /BL select a column of the memory cell array 11.

A column select circuit 12 is connected to the plurality of pairs of bit lines BL and /BL via a sense amplifier circuit (not shown) that detects and amplifies data. A column decoder 13 is connected to the column select circuit 12. An external circuit inputs an address signal ADD to the column decoder 13 via an address buffer (not shown) and address predecoder (not shown). The column decoder 13 supplies a column select signal to the column select circuit 12 on the basis of a column address signal. The column select circuit 12 selects a corresponding one of the pairs of bit lines BL and /BL on the basis of the column select signal.

A write/read circuit 14 is connected to the column select circuit 12. The write/read circuit 14 writes data to or reads it from the column selected by the column select circuit 12. More specifically, the write/read circuit 14 writes input data DI input from an external circuit to the memory cell array 11 as write data. The write/read circuit 14 also outputs, to an external circuit, read data read from the memory cell array 11 as output data DO.

Before execution of the read/write operation, a precharge circuit 15 precharges the pair of bit lines BL and /BL to a high-level voltage (e.g., fixed power supply voltage VDDA). For example, the precharge circuit 15 executes the precharge operation on the basis of a precharge signal supplied from a control circuit 16. More specifically, the precharge circuit 15 precharges the pair of bit lines BL and /BL to the fixed power supply voltage VDDA when the precharge signal is activated. On the other hand, the precharge circuit 15 cancels precharge when the precharge signal is deactivated.

A word line switching circuit 17, word line driver circuit 18, and row decoder 19 are connected to the plurality of word lines WL. The external circuit inputs the address signal ADD to the row decoder 19 via the address buffer (not shown) and address predecoder (not shown). The row decoder 19 selects a corresponding one of the word lines WL on the basis of a row address signal.

The control circuit 16 controls the circuits in the SRAM 2. An external circuit inputs a clock signal CLK (not shown) and control signal CNT to the control circuit 16. The control circuit 16 controls the precharge operation, write operation, and read operation on the basis of, e.g., the control signal CNT. The sleep signal /SLP is also input to the control circuit 16.

The SRAM 2 has a normal operation mode and a sleep mode. In the normal operation mode, an external circuit is accessing the SRAM 2 (including data write to the memory cell MC and data read from the memory cell MC). In the sleep mode, the SRAM 2 is holding stored data but not being accessed (neither data read nor data write is executed). The sleep signal /SLP supplied from the control circuit 16 controls the sleep mode.

Figure 3:
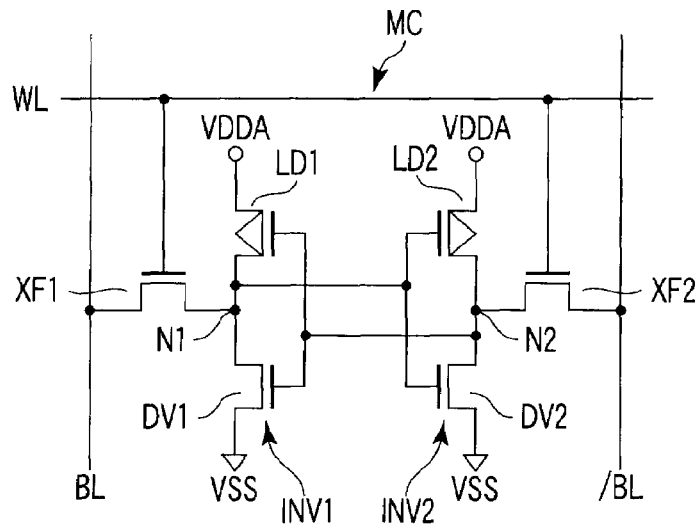
FIG. 3 is a circuit diagram illustrating the arrangement of a memory cell MC shown in FIG. 2.

FIG. 3 is a circuit diagram illustrating the arrangement of the memory cell MC shown in FIG. 2. The memory cell MC has a first inverter circuit INV1 and a second inverter circuit INV2. The first inverter circuit INV1 includes a load P-channel MOS transistor (PMOS transistor) LD1 and a driving N-channel MOS transistor (NMOS transistor) DV1. The PMOS transistor LD1 and NMOS transistor DV1 are connected in series between the fixed power supply terminal VDDA and a ground terminal VSS.

The second inverter circuit INV2 includes a load PMOS transistor LD2 and a driving NMOS transistor DV2. The PMOS transistor LD2 and NMOS transistor DV2 are connected in series between the fixed power supply terminal VDDA and the ground terminal VSS.

More specifically, the source terminal of the PMOS transistor LD1 is connected to the fixed power supply terminal VDDA. The drain terminal of the PMOS transistor LD1 is connected to the drain terminal of the NMOS transistor DV1 via a storage node N1. The gate terminal of the PMOS transistor LD1 is connected to the gate terminal of the NMOS transistor DV1. The source terminal of the NMOS transistor DV1 is connected to the ground terminal.

The source terminal of the PMOS transistor LD2 is connected to the fixed power supply terminal VDDA. The drain terminal of the PMOS transistor LD2 is connected to the drain terminal of the NMOS transistor DV2 via a storage node N2. The gate terminal of the PMOS transistor LD2 is connected to the gate terminal of the NMOS transistor DV2. The source terminal of the NMOS transistor DV2 is connected to the ground terminal.

The gate terminal of the PMOS transistor LD1 is connected to the storage node N2. The gate terminal of the PMOS transistor LD2 is connected to the storage node N1. In other words, the first inverter circuit INV1 and second inverter circuit INV2 are cross-coupled to each other. That is, the output terminal of the first inverter circuit INV1 is connected to the input terminal of the second inverter circuit INV2. The output terminal of the second inverter circuit INV2 is connected to the input terminal of the first inverter circuit INV1.

The storage node N1 is connected to the bit line BL via a transfer gate XF1 formed from an NMOS transistor. The gate terminal of the transfer gate XF1 is connected to the word line WL.

The storage node N2 is connected to the bit line /BL via a transfer gate XF2 formed from an NMOS transistor. The gate terminal of the transfer gate XF2 is connected to the word line WL. The memory cell MC is formed in this way.

The SRAM 2 operates using two power supply voltages: fixed power supply voltage VDDA and variable power supply voltage VDD. For this purpose, the semiconductor memory device 1 comprises the power supply control circuit 3. An external device applies the fixed power supply voltage VDDA to the power supply control circuit 3. The power supply control circuit 3 generates the variable power supply voltage VDD by using the fixed power supply voltage VDDA. The fixed power supply voltage VDDA is set to, e.g., 1.2 V. The variable power supply voltage VDD changes within the range of 0 to 1.2 V in accordance with the operation of the SRAM 2.

The fixed power supply voltage VDDA is applied to the memory cell array 11, word line driver circuit 18, and signal generation circuit 20. The variable power supply voltage VDD is applied to the remaining peripheral circuits. The variable power supply voltage VDD is set to a voltage necessary for the SRAM 2 to operate at a requested speed in each operation mode of the processor. For example, in a mode that requires a high-speed operation of the SRAM 2, the variable power supply voltage VDD is set to 1.2 V. In a mode that permits a relatively low speed, the variable power supply voltage VDD is set to about 1.0 V.

The memory cell MC cannot greatly decrease the power supply voltage because of the need for ensuring the data hold stability. The word line potential cannot greatly be decreased, either, from the viewpoint of ensuring a margin (write margin) in data write to a memory cell and ensuring a cell current.

For these reasons, the fixed power supply voltage VDDA of 1.2 V is applied to the memory cells MC and word line driver circuit 18.

As described above, the power supply voltage applied to the memory cell MC and word line driver circuit 18 is fixed, and only the variable power supply voltage VDD is dynamically changed in accordance with the operation mode. This ensures the data hold stability and write margin of the memory cell MC and reduces the power consumption of the chip as compared to a case wherein the chip is operated at a high fixed power supply voltage in all modes.

Figure 4:
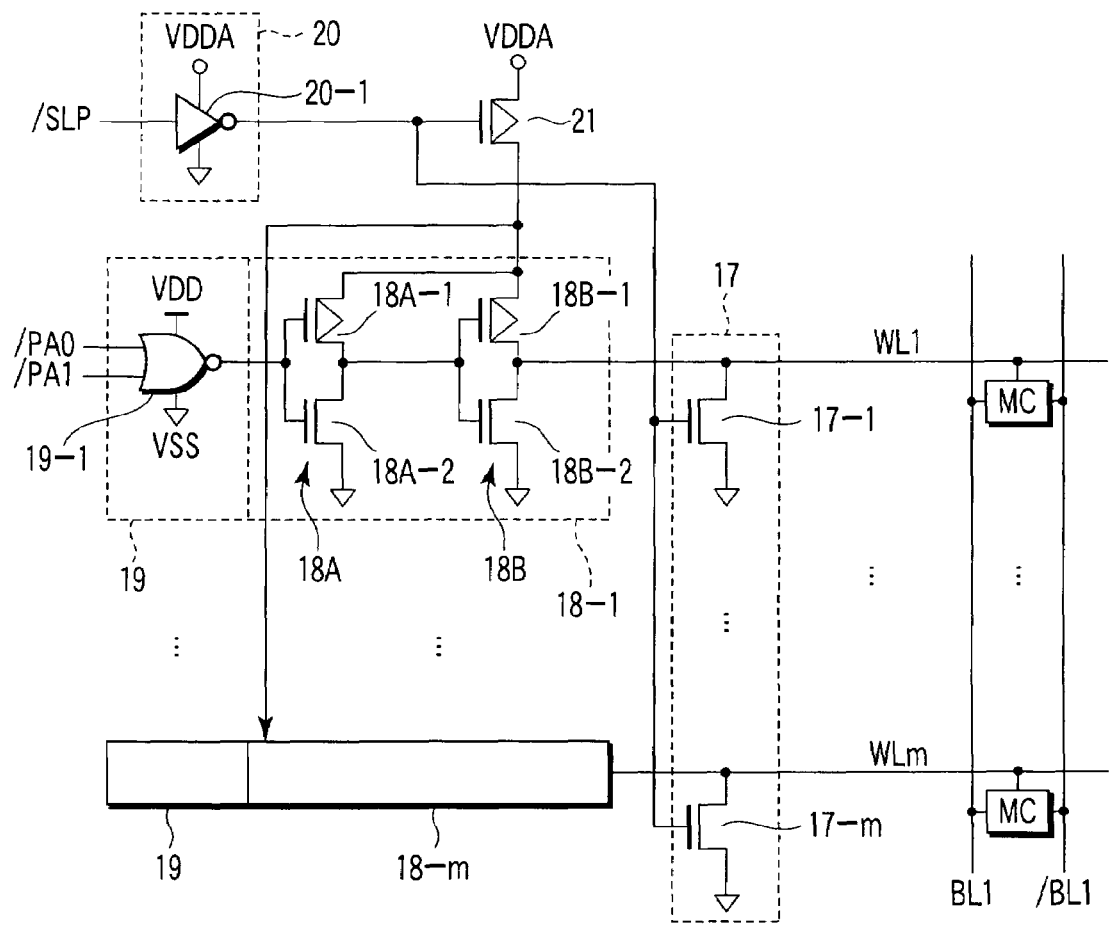
FIG. 4 is a circuit diagram mainly illustrating a word line driver circuit 18 and a word line switching circuit 17.

FIG. 4 is a circuit diagram mainly illustrating the word line driver circuit 18 and word line switching circuit 17. The sleep signal /SLP output from the control circuit 16 is supplied to the signal generation circuit 20. The sleep signal /SLP is made low in the sleep mode and high in the normal operation mode.

The signal generation circuit 20 includes an inverter circuit 20-1. The inverter circuit 20-1 outputs an inverted signal of the sleep signal /SLP. The fixed power supply voltage VDDA is applied to the power supply terminal of the inverter circuit 20-1.

The word line driver circuit 18 comprises a plurality of word line drivers 18-1 to 18-m corresponding to the plurality of word lines WL1 to WLm. The word line driver 18-1 is formed by connecting two inverter circuits 18A and 18B in series. The inverter circuit 18A includes a CMOS (Complementary Metal Oxide Semiconductor) gate (including a PMOS transistor 18A-1 and an NMOS transistor 18A-2). The inverter circuit 18B also includes a CMOS gate (including a PMOS transistor 18B-1 and an NMOS transistor 18B-2).

The power supply terminals of the inverter circuits (CMOS gates) 18A and 18B (more specifically, the source terminals of the PMOS transistors 18A-1 and 18B-1) are connected to the fixed power supply terminal VDDA via a cutoff switch 21. The cutoff switch 21 is formed from a PMOS transistor 21. That is, the source terminal of the PMOS transistor 21 is connected to the fixed power supply terminal VDDA. The drain terminal of the PMOS transistor 21 is connected to the power supply terminals of the inverter circuits 18A and 18B. The signal generation circuit 20 supplies the inverted signal of the sleep signal /SLP to the gate terminal of the PMOS transistor 21. The remaining word line drivers 18-2 to 18-m have the same arrangement as the word line driver 18-1.

The word line switching circuit 17 comprises a plurality of NMOS transistors 17-1 to 17-m corresponding to the plurality of word lines WL1 to WLm. The source terminal of the NMOS transistor 17-1 is connected to the ground terminal. The drain terminal of the NMOS transistor 17-1 is connected to the word line WL1. The inverted signal of the sleep signal /SLP is supplied to the gate terminal of the NMOS transistor 17-1. The NMOS transistors 17-2 to 17-m provided in correspondence with the word lines WL2 to WLm have the same arrangement as the NMOS transistor 17-1.

The row decoder 19 includes a plurality of NOR circuits 19-1 corresponding to the plurality of word lines WL1 to WLm. The power supply terminals of the plurality of NOR circuits 19-1 are connected to the variable power supply terminal VDD. The row decoder 19 decodes a row address signal (including /PA0 and /PA1). The decoded signal is supplied to the word line driver circuit 18 (more specifically, the input terminal of the inverter circuit 18A).

Figure 5:
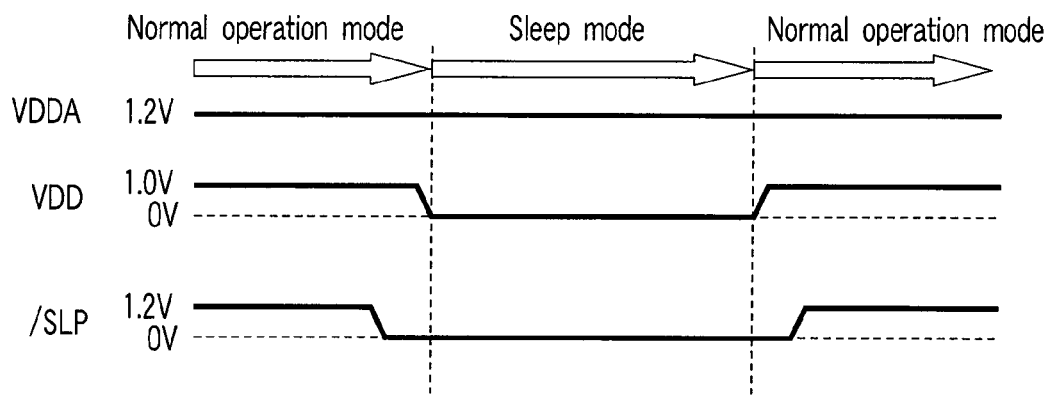
FIG. 5 is a chart illustrating the waveform of a variable power supply voltage VDD in a normal operation mode and in a sleep mode.

The operation of the power supply control circuit 3 will be described next. The power supply control circuit 3 generates the variable power supply voltage VDD in accordance with the operation speed of the SRAM 2. The variable power supply voltage VDD is determined under the control of a processor (not shown) provided in the semiconductor memory device 1. The power supply control circuit 3 also sets the variable power supply voltage VDD to, e.g., 1.0 V in the normal operation mode and 0 V in the sleep mode. FIG. 5 is a chart illustrating the waveform of the variable power supply voltage VDD in the normal operation mode and in the sleep mode.

The sleep signal /SLP is supplied to the power supply control circuit 3. To set the sleep mode, the power supply control circuit 3 sets the variable power supply voltage VDD to 0 V after the sleep signal /SLP goes low. To end the sleep mode, the power supply control circuit 3 sets the variable power supply voltage VDD to, e.g., 1.0 V before the sleep signal /SLP goes high.

The operation of the semiconductor memory device 1 having the above-described arrangement will be described. In the normal operation mode, the sleep signal /SLP is made high. Hence, the signal generation circuit 20 outputs an inverted, i.e., low, signal. This turns on the PMOS transistor 21 so that the fixed power supply voltage VDDA is applied to the word line driver circuit 18.

All the NMOS transistors 17-1 to 17-m included in the word line switching circuit 17 are turned off. The variable power supply voltage VDD of, e.g., 1.0 V is applied to the row decoder 19. One word line WL based on the address signal is activated, and data is written to or read from the memory cells MC.

In the sleep mode, the sleep signal /SLP is made low. At this time, the signal generation circuit 20 outputs an inverted, i.e., high, signal. This turns off the PMOS transistor 21 so that the fixed power supply voltage VDDA to the word line driver circuit 18 is cut off. This reduces the leakage current of the word line driver circuit 18.

When the fixed power supply voltage VDDA to the word line driver circuit 18 is cut off, the output from the word line driver circuit 18 formed from inverter circuits becomes indefinite. This may make the potentials of the word lines WL indefinite, and several word lines WL may be activated. More specifically, if a plurality of word lines WL are activated in the sleep mode, the transfer gates XF1 and XF2 of the memory cell MC are turned on. This may destroy the data in the memory cell MC via the bit lines.

To prevent this, in this embodiment, the word line switching circuit 17 is connected to the word lines WL. When the inverted signal output from the signal generation circuit 20 goes high, all the NMOS transistors 17-1 to 17-m included in the word line switching circuit 17 are turned on. All word lines WL are set to the ground voltage VSS. That is, all word lines WL are deactivated. In this embodiment, since all word lines WL are set to the ground voltage VSS in the sleep mode, destruction of data in the memory cells MC can be prevented.

As described above, in the sleep mode, the fixed power supply voltage VDDA to the inverter circuit 18B with the output terminal connected to the word line WL is cut off. This prevents the PMOS transistor 18B-1 of the inverter circuit 18B from pulling up the word line WL to the fixed power supply voltage VDDA. It is consequently possible to reliably set the potential of the word line WL to the ground voltage VSS in the sleep mode.

As shown in FIG. 3, the fixed power supply voltage VDDA is applied to the memory cell MC. Hence, the memory cell MC can hold data even in the sleep mode. It is necessary to supply the sleep signal /SLP or its inverted signal to a predetermined circuit even when the variable power supply voltage VDD is set to 0 V in the sleep mode. For this purpose, the signal generation circuit 20 includes the inverter circuit 20-1 whose power supply terminal receives the fixed power supply voltage VDDA. Hence, the signal generation circuit 20 can control the cutoff switch 21 and word line switching circuit 17 even in the sleep mode.

On the other hand, the variable power supply voltage VDD is applied to the row decoder 19. This reduces the power consumption of the row decoder 19 in accordance with the operation speed. In the sleep mode, the power supply control circuit 3 sets the variable power supply voltage VDD to 0 V. This further reduces the power consumption of the row decoder 19 in the sleep mode. The variable power supply voltage VDD is applied to most peripheral circuits including the address buffer, data input/output buffer, control signal input buffer, address predecoder, and read/write circuit. It is therefore possible to reduce the leakage current of these peripheral circuit, too.

As described above, to set the sleep mode, the power supply control circuit 3 sets the variable power supply voltage VDD to 0 V after a sleep-in signal /SLP_IN goes low. If the variable power supply voltage VDD drops to 0 V first, the outputs of the NOR circuits 19-1 included in the row decoder 19 become indefinite before the PMOS transistor 21 is turned off, and a through current flows to the word line driver circuit 18. For the same reason, to end the sleep mode, the power supply control circuit 3 sets the variable power supply voltage VDD to, e.g., 1.0 V before the sleep-in signal /SLP_IN goes high.

As described above in detail, according to this embodiment, the cutoff switch 21 cuts off the fixed power supply voltage VDDA to the word line driver circuit 18 in the sleep mode. This reduces the leakage current of the word line driver circuit 18.

In the sleep mode, all word lines WL are set to the ground voltage VSS. For this reason, even when the fixed power supply voltage VDDA to the word line driver circuit 18 is cut off, destruction of data in the memory cells MC can be prevented.

The variable power supply voltage VDD is applied to the peripheral circuits including the row decoder 19. This reduces the power consumption of the peripheral circuits. In the sleep mode, the variable power supply voltage VDD is set to 0 V. This further reduces the power consumption of the peripheral circuits in the sleep mode.

To set the sleep mode, the variable power supply voltage VDD drops to 0 V after the sleep signal /SLP goes low. This prevents a through current from flowing to the word line driver circuit 18.

The plurality of word line drivers share the cutoff switch 21. It is therefore possible to suppress an increase in the chip area even when this embodiment is applied.

Second Embodiment

In the second embodiment, of inverter circuits 18A and 18B of a word line driver circuit 18, the inverter circuit 18A cuts off a ground voltage VSS while the inverter circuit 18B cuts off a fixed power supply voltage VDDA in a sleep mode, thereby reducing the leakage current of the word line driver circuit 18.

Figure 6:
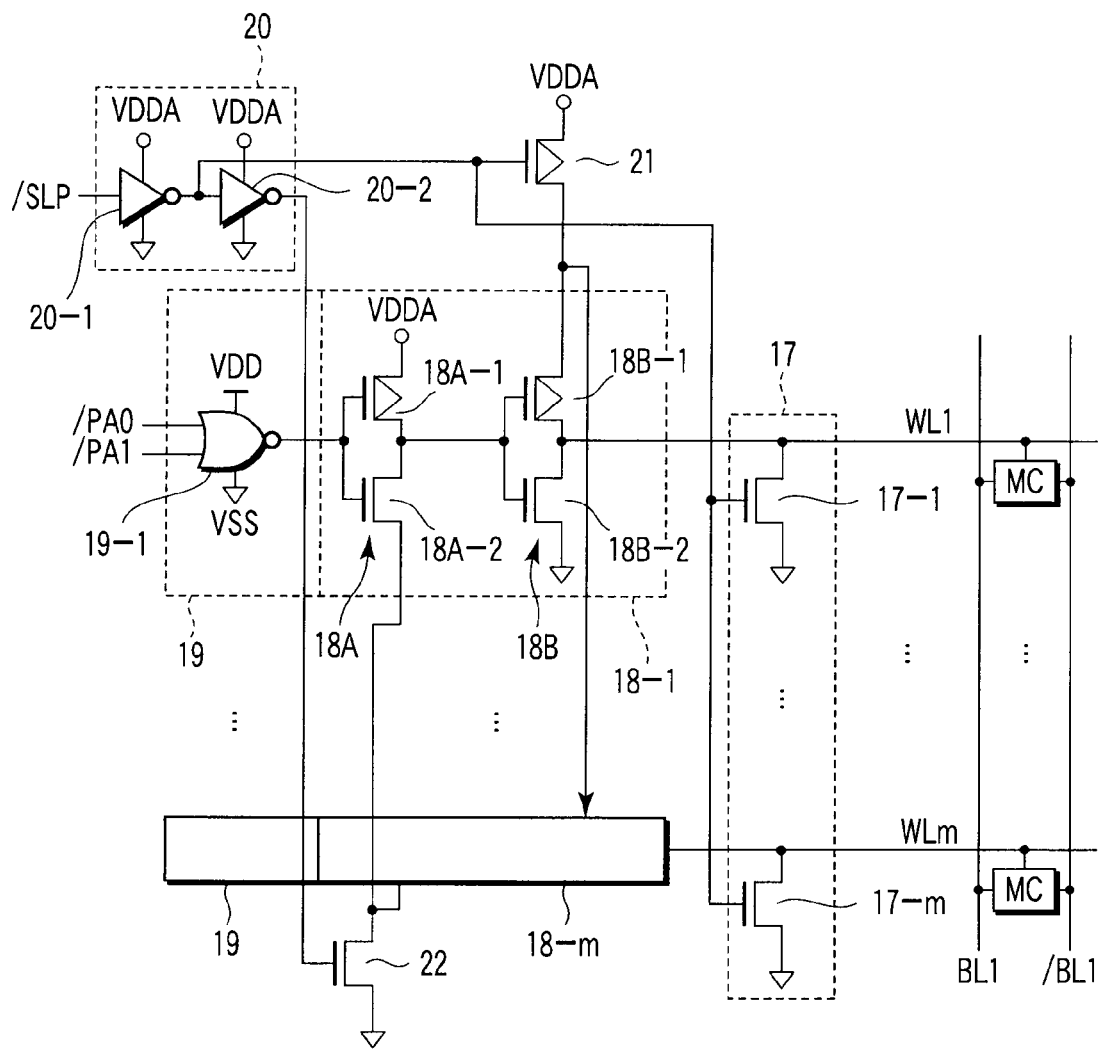
FIG. 6 is a circuit diagram illustrating the arrangement of main parts of an SRAM 2 according to a second embodiment of the present invention.

FIG. 6 is a circuit diagram illustrating the arrangement of main parts of an SRAM 2 according to the second embodiment of the present invention. A signal generation circuit 20 is formed by connecting two inverter circuits 20-1 and 20-2 in series. The inverter circuit 20-1 outputs an inverted signal of a sleep signal /SLP. The inverter circuit 20-2 outputs the sleep signal /SLP. The power supply terminals of the inverter circuits 20-1 and 20-2 are connected to the fixed power supply terminal VDDA.

The power supply terminal of the inverter circuit 18B (i.e., the source terminal of a PMOS transistor 18B-1) is connected to the fixed power supply terminal VDDA via a cutoff switch 21. The low-potential power supply terminal of the inverter circuit 18B (i.e., the source terminal of an NMOS transistor 18B-2) is connected to the ground terminal VSS.

The SRAM 2 has a cutoff switch 22. The cutoff switch 22 is formed from an NMOS transistor 22. The low-potential power supply terminal of the inverter circuit 18A (i.e., the source terminal of an NMOS transistor 18A-2) is connected to the ground terminal VSS via the NMOS transistor 22. That is, the source terminal of the NMOS transistor 22 is connected to the ground terminal VSS. The drain terminal of the NMOS transistor 22 is connected to the source terminal of the NMOS transistor 18A-2. The gate terminal of the NMOS transistor 22 receives the sleep signal /SLP from the signal generation circuit 20 (more specifically, inverter circuit 20-2). The high-potential power supply terminal of the inverter circuit 18A (i.e., the source terminal of a PMOS transistor 18A-1) is connected to the fixed power supply voltage VDDA.

The operation of a semiconductor memory device 1 having the above-described arrangement will be described. In a normal operation mode, the sleep signal /SLP is made high. Hence, the inverter circuit 20-1 of the signal generation circuit 20 outputs an inverted, i.e., low, signal. This turns on the PMOS transistor 21 so that the fixed power supply voltage VDDA is applied to the inverter circuit 18B of the word line driver circuit 18. The inverter circuit 20-2 of the signal generation circuit 20 outputs a high signal. This turns on the NMOS transistor 22 so that the ground voltage VSS is applied to the inverter circuit 18A of the word line driver circuit 18.

All NMOS transistors 17-1 to 17-m included in a word line switching circuit 17 are turned off. A variable power supply voltage VDD of, e.g., 1.0 V is applied to a row decoder 19. One word line WL based on the address signal is activated, and data is written to or read from memory cells MC.

In the sleep mode, the sleep signal /SLP is made low. At this time, the inverter circuit 20-1 of the signal generation circuit 20 outputs an inverted, i.e., high, signal. This turns off the PMOS transistor 21 so that the fixed power supply voltage VDDA to the inverter circuit 18B of the word line driver circuit 18 is cut off.

The inverter circuit 20-2 of the signal generation circuit 20 outputs a low signal. This turns off the NMOS transistor 22 so that the ground voltage VSS to the inverter circuit 18A of the word line driver circuit 18 is cut off. This reduces the leakage current of the word line driver circuit 18.

When the ground voltage VSS to the inverter circuit 18A is cut off, a low potential is not applied to the gate terminal of the PMOS transistor 18B-1 of the succeeding stage of the inverter circuit 18A. This prevents the PMOS transistor 18B-1 from being turned on. It is therefore possible to prevent the word line WL from being pulled up to the fixed power supply voltage VDDA.

When the inverted signal output from the inverter circuit 20-1 of the signal generation circuit 20 goes high, all the NMOS transistors 17-1 to 17-m included in the word line switching circuit 17 are turned on. All word lines WL are set to the ground voltage VSS. That is, all word lines WL are deactivated. This prevents destruction of data in the memory cells MC. The other effects are the same as in the first embodiment.

Third Embodiment

In the third embodiment, a fixed power supply voltage VDDA to a memory cell MC is cut off in a sleep mode, thereby further reducing the leakage current.

FIG. 7 is a circuit diagram illustrating the arrangement of main parts of an SRAM 2 according to the third embodiment of the present invention. The SRAM 2 has a cutoff switch 23. The cutoff switch 23 is formed from a PMOS transistor 23.

The high-potential power supply terminals of each memory cell (more specifically, the source terminals of load PMOS transistors LD1 and LD2) are connected to the fixed power supply terminal VDDA via the cutoff switch 23. The cutoff switch 23 is formed from a PMOS transistor 23. That is, the source terminal of the PMOS transistor 23 is connected to the fixed power supply terminal VDDA. The drain terminal of the PMOS transistor 23 is connected to the high-potential power supply terminals of each memory cell. The gate terminal of the PMOS transistor 23 receives an inverted signal of a sleep signal /SLP from a signal generation circuit 20. The remaining parts have the same arrangement as in the semiconductor memory device 1 of the first embodiment.

The operation of a semiconductor memory device 1 having the above-described arrangement will be described. In a normal operation mode, the sleep signal /SLP is made high. Hence, the signal generation circuit 20 outputs an inverted, i.e., low, signal. This turns on the PMOS transistor 23 so that the fixed power supply voltage VDDA is applied to each memory cell MC. This allows data to be written to or read from the memory cell MC.

In the sleep mode, the sleep signal /SLP is made low. At this time, the signal generation circuit 20 outputs an inverted, i.e., high, signal. This turns off the PMOS transistor 23 so that the fixed power supply voltage VDDA to each memory cell MC is cut off. This reduces the leakage current of each memory cell MC in the sleep mode.

In this embodiment, although cell data is not held in the sleep mode, the leakage current can further be reduced as compared to the first embodiment. The fixed power supply voltage VDDA is not set to 0 V even in the sleep mode and is fixed to 1.2 V. When the fixed power supply voltage VDDA is also set to 0 V, like a variable power supply voltage VDD, the leakage current of the memory cell MC can be reduced. However, to do this, one more power supply regulator system to control the fixed power supply voltage VDDA is necessary in addition to that for the variable power supply voltage VDD, resulting in an increase in cost.

That is, in this embodiment, the leakage current of the memory cell MC can be reduced while suppressing the increase in cost by using only one power supply regulator system for the variable power supply voltage VDD. This embodiment is applicable to the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which operates by using a fixed power and a variable power, comprising:
   a plurality of word lines which select rows of a memory cell array;
   a plurality of word line drivers each of which is connected to a corresponding one of the word lines and includes a first CMOS gate;
   a first cutoff switch which is connected between a fixed power terminal and a power terminal of the first CMOS gate and cuts off the fixed power in a sleep mode;
   a switching circuit which is connected to the plurality of word lines and connects the plurality of word lines to a ground terminal in the sleep mode;
   a power control circuit which generates the variable power by using the fixed power and sets the variable power to 0 V in the sleep mode; and
   a row decoder to which the variable power is applied and which is connected to the plurality of word line drivers and selects a word line on the basis of an address signal.

2. The device according to claim 1, wherein a voltage value of the variable power changes in accordance with an operation speed in a normal operation mode in which data write and read are executed.

3. The device according to claim 1, wherein the first CMOS gate includes a P-type transistor and an N-type transistor which are connected in series.

4. The device according to claim 3, wherein
   a source terminal of the P-type transistor is connected to the first cutoff switch,
   a drain terminal of the P-type transistor is connected to the word line and a drain terminal of the N-type transistor, and
   a source terminal of the N-type transistor is connected to the ground terminal.

5. The device according to claim 1, further comprising a signal generation circuit which receives a sleep signal, and opens or closes the first cutoff switch and the switching circuit on the basis of the sleep signal.

6. The device according to claim 1, wherein each word line driver includes a second CMOS gate connected to a preceding stage of the first CMOS gate.

7. The device according to claim 6, further comprising a second cutoff switch which is connected between the ground terminal and a power terminal of the second CMOS gate and cuts off a ground voltage in the sleep mode.

8. The device according to claim 7, wherein a power terminal of the second CMOS gate is connected to the fixed power terminal.

9. The device according to claim 8, wherein the second CMOS gate includes a P-type transistor and an N-type transistor which are connected in series.

10. The device according to claim 9, wherein
    a source terminal of the P-type transistor is connected to the fixed power terminal,
    a drain terminal of the P-type transistor is connected to an input terminal of the first CMOS gate and a drain terminal of the N-type transistor, and
    a source terminal of the N-type transistor is connected to the second cutoff switch.

11. The device according to claim 7, further comprising a signal generation circuit which receives a sleep signal, and opens or closes the second cutoff switch on the basis of the sleep signal.

12. The device according to claim 1, wherein
    the memory cell array includes a plurality of memory cells, and
    each of the memory cells includes a first inverter circuit and a second inverter circuit which are cross-coupled to each other.

13. The device according to claim 12, wherein power terminals of the first inverter circuit and the second inverter circuit are connected to the fixed power terminal.

14. The device according to claim 12, further comprising a third cutoff switch which is connected between the fixed power terminal and the power terminals of the first inverter circuit and the second inverter circuit and cuts off the fixed power in the sleep mode.

15. The device according to claim 14, wherein each of the first inverter circuit and the second inverter circuit includes a P-type transistor and an N-type transistor which are connected in series between the third cutoff switch and the ground terminal.

16. The device according to claim 1, wherein the first cutoff switch includes a P-type transistor having a source terminal connected to the fixed power terminal, a drain terminal connected to the power terminal of the first CMOS gate, and a gate terminal which receives a sleep signal to be made high in the sleep mode.

17. The device according to claim 1, wherein
the switching circuit includes a plurality of N-type transistors corresponding to the plurality of word lines, and
each of the N-type transistors has a drain terminal connected to the word line, a source terminal connected to the ground terminal, and a gate terminal which receives a sleep signal to be made high in the sleep mode.

18. The device according to claim 7, wherein the second cutoff switch includes an N-type transistor having a drain terminal connected to the power terminal of the second CMOS gate, a source terminal connected to the ground terminal, and a gate terminal which receives a sleep signal to be made low in the sleep mode.

19. The device according to claim 14, wherein the third cutoff switch includes a P-type transistor having a source terminal connected to the fixed power terminal, a drain terminal connected to the power terminals of the first inverter circuit and the second inverter circuit, and a gate terminal which receives a sleep signal to be made high in the sleep mode.

* * * * *